United States Patent [19]

King

[11] 4,204,174
[45] May 20, 1980

[54] PHASE LOCKED LOOP VARIABLE FREQUENCY GENERATOR

[75] Inventor: Nigel J. R. King, Wokingham, England

[73] Assignee: Racal Communications Equipment Limited, England

[21] Appl. No.: 959,240

[22] Filed: Nov. 9, 1978

[30] Foreign Application Priority Data

Jul. 22, 1978 [GB] United Kingdom ............... 30779/78

[51] Int. Cl.² ............................................. H03B 3/04
[52] U.S. Cl. ..................................... 331/10; 331/14; 331/16; 331/25
[58] Field of Search ................... 331/1 A, 10, 14, 16, 331/25

[56] References Cited

U.S. PATENT DOCUMENTS

| | | | |
|---|---|---|---|
| 3,516,007 | 6/1970 | Bos et al. | 331/18 |
| 3,872,397 | 3/1975 | Hanneman | 331/1 A |
| 3,928,813 | 12/1975 | Kingsford-Smith | 331/1 A |

*Primary Examiner*—Siegfried H. Grimm
*Attorney, Agent, or Firm*—Leydig, Voit, Osann, Mayer & Holt, Ltd.

[57] ABSTRACT

The invention relates to phase locked loops in which a variable-frequency voltage-controlled oscillator (VCO) feeds a phase comparator via an adjustable divider having a division factor N. The comparator compares the phases of the divided frequency (Fd) and a reference frequency (Fr), and adjusts the VCO to produce phase equality. To enable the VCO frequency (FO) to be adjusted in smaller steps than Fr and yet maintain a loop bandwidth greater than the step size with good spurious performance (thus providing a "fractional N synthesizer"), Fo is made slightly more than N.Fr. The phase detector thus produces a phase error signal. At periodic instants, determined by the period of the frequency difference between Fo and N.Fr, a control unit temporarily increases N by unity so as to bring Fd and Fr into phase. To eliminate the sawtooth waveform that would otherwise be produced on the phase error signal, the control unit also produces unit increases in N during each such period so as to produce a phase difference between Fd and Fr which is opposite in sign to, and substantially offsets, the integrated value of the phase differences up to that instant. The phase error signal therefore undergoes only residual variations, and these are backed off by an analogue output derived from the control unit.

8 Claims, 5 Drawing Figures

PHASE LOCKED LOOP VARIABLE FREQUENCY GENERATOR

BACKGROUND OF THE INVENTION

The invention relates to electrical circuit arrangements and more specifically to electrical circuit arrangements for producing variable frequency outputs.

Electrical circuit arrangements for producing variable frequency outputs are known in the form of phase locked loops in which a variable frequency voltage-controlled oscillator (VCO) feeds a phase comparator via an adjustable divider having a division factor of N. The phase comparator compares the phase of the divided frequency with the phase of a reference frequency, and adjusts the VCO to produce phase equality. The VCO frequency (the output of the arrangement) can therefore be adjusted in steps each equal to the reference frequency by making unit changes in the division factor.

The disadvantage of such an arrangement, however, is that the minimum step change possible in the output frequency is the same size as the reference frequency.

An object of the invention, therefore is to provide an improved electrical frequency control arrangement.

A more specific object of the invention is to provide an electrical frequency control arrangement incorporating a phase locked loop in which a variable frequency voltage-controlled oscillator feeds a phase comparator via an adjustable divider, in which the VCO frequency can be adjusted in smaller steps than the reference frequency. It is also an object of the invention to provide, in such a frequency control arrangement a loop bandwidth greater than the step size with good spurious performance and without using close tolerance components.

BRIEF SUMMARY OF THE INVENTION

According to the invention, there is provided an electrical circuit arrangement for producing a variable frequency output, comprising: a variable frequency source producing an output frequency; an integrally adjustable frequency divider connected to receive the output frequency to produce a divided frequency; a reference frequency source; a phase comparator connected to compare the phase of the divided frequency with the phase of a reference frequency whereby to produce an output whose sign and level depend on the phase difference; means feeding the output to the variable frequency source to control its output frequency in a sense tending to reduce the said phase difference to zero; means for periodically varying the division factor of the divider whereby its average value is such that the output frequency has a desired value; means operative within each period of variation of the division factor to cause repeated and temporary shifts in the phase of the divided frequency with respect to the reference frequency whereby to offset the effect on its output signal which the phase differences detected by the phase detector up to that shift would otherwise have; and means for offsetting the residual variations of the output signal of the phase detector between the said shifts.

In this way, the residual variations of the phase detector output which have to be backed off are small and can be backed off by means of an analog output which does not have to be produced by close tolerance components.

BRIEF SUMMARY OF THE DRAWINGS

An electrical circuit arrangement embodying the invention, and for producing a variable frequency output, will now be described by way of example, and with reference to the accompanying diagrammatic drawings in which.

DESCRIPTION OF PREFERRED EMBODIMENTS

Figure 1:
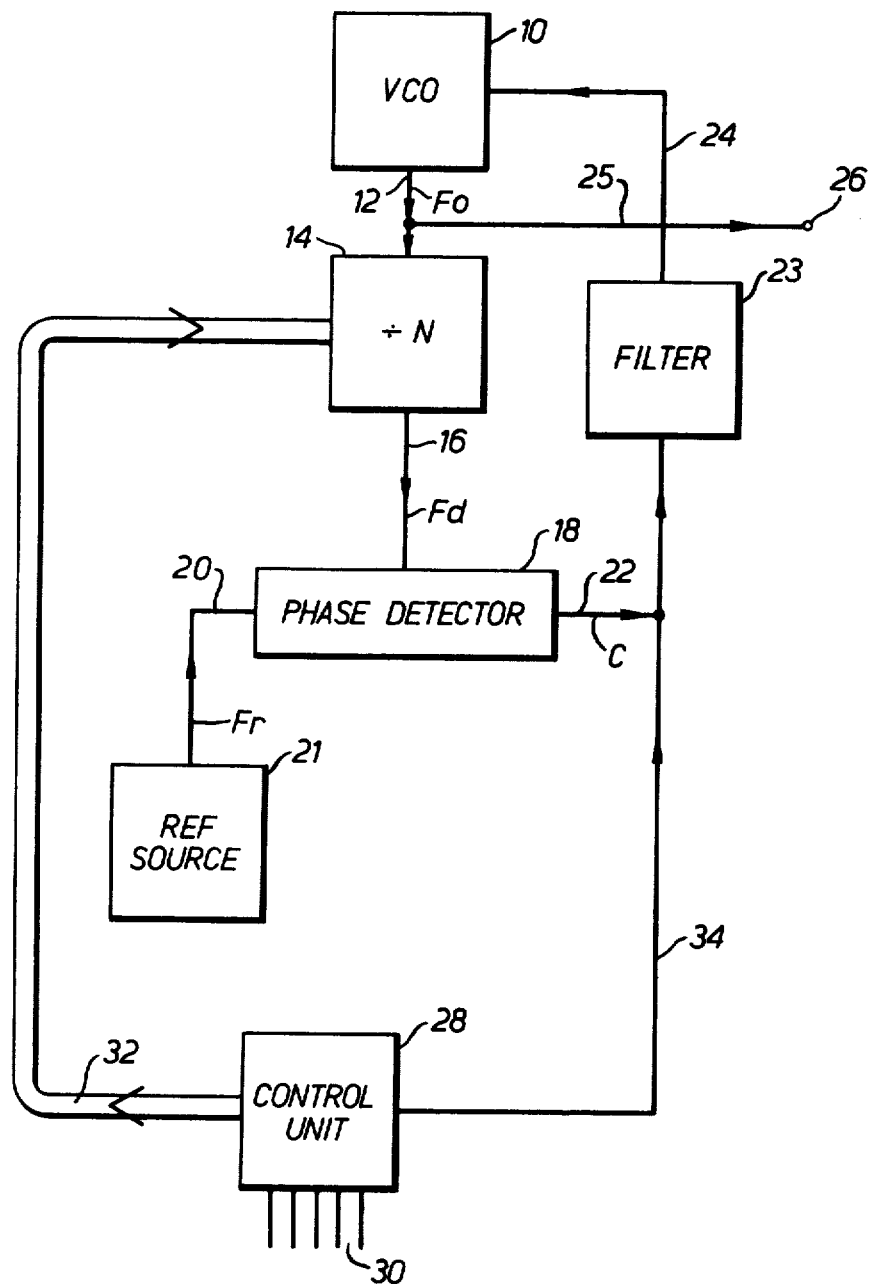
FIG. 1 is a simplified block diagram of the circuit arrangement.

As shown in the simplified block diagram of FIG. 1, the circuit arrangement comprises a voltage-controlled oscillator (VCO) 10 producing an output frequency Fo on an output line 12 which is connected to one input of a divide-by-N divider 14. The output, Fd, of the divider 14 is fed on a line 16 to a phase detector 18 which also receives a reference frequency, Fr, on a line 20 from a reference source 21. The phase detector 18 compares the phases of the signals Fd and Fr and produces a control signal C on an output line 22, the signal C being dependent on the phase difference. Line 22 is connected to the VCO 10 through a low pass filter 23 and a line 24 and adjusts the frequency Fo such as to tend to maintain the frequencies Fd and Fr in phase equality.

A line 25 connects the VCO frequency Fo to an output terminal 26.

A control unit 28 receives information, for example digital information, on input lines 30 representing the desired value of the output frequency Fo, and the control unit 28, by means of a control channel 32, controls the division factor N of the divider 14 so that Fo has the desired value. The control unit 28 also has an output line 34 which is connected to line 22.

It will be apparent that a unit change in the value of N will change the value of the output frequency Fo by an amount equal to the reference frequency Fr. Thus, for example, if Fr is 100 kHz and N is 10, then the output frequency Fo will be 1 MHz. If now N is changed to 11, then in order to maintain Fd at 100 kHz, the value of signal C will have to change in a direction and by an amount such as to adjust the frequency Fo of the VCO 10 to 1.1 MHz.

Figure 2:
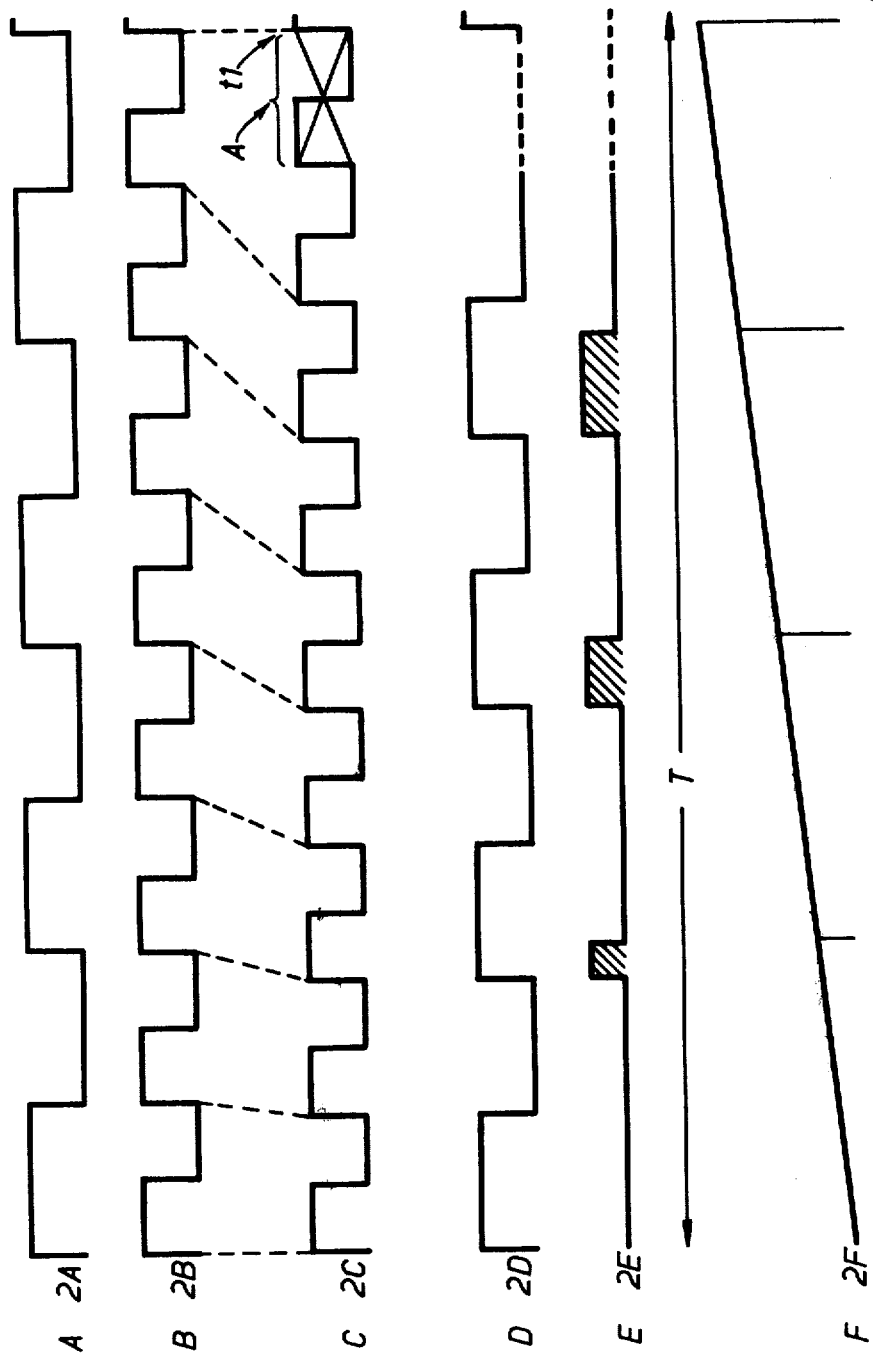
FIG. 2 shows waveforms for explaining the operation of the arrangement of FIG. 1.

However, in a manner now to be described briefly with reference to FIG. 1 and then in more detail with reference to FIG. 2, the circuit arrangement is also able to change the value of Fo by smaller amounts than Fr. Initially, it will be assumed that lines 22 and 24 are broken so that the phase detector 18 is not controlling the frequency of the VCO. It will further be assumed that Fr is 100 kHz, that Fo is 10.1 MHz and that N is 10. It therefore follows that Fd is 101 kHz, and therefore not exactly equal to Fr (which is 100 kHz). Therefore, a phase error will be detected by the phase detector 18. For each period of Fr, therefore, Fo will, instead of producing 10 pulses, produce 10.1 pulses and will therefore advance in phase by 0.1 of a cycle. Thus, after 10 periods of Fr, Fo will have produced 101 pulses and will have advanced in phase by one complete cycle.

Throughout this time, Fd will be advancing on Fr and the output, C, of the phase detector 18 will continue to increase progressively. If line 22 were reconnected to the control input of the VCO 10, this signal C would of course tend to adjust Fo until it was exactly at 10 MHz.

However, in a manner to be described in detail below, the control unit 28 is arranged to operate when Fo has advanced by one complete cycle to remove or absorb one complete cycle of Fo. This simultaneously adjusts the phase of Fd and brings Fd into phase with Fr. The output C of the phase detector thus falls to zero.

Since frequency Fo is still at 10.1 MHz, the phase error between Fd and Fr will start again to build up and the value of signal C will increase once more, until, after a further 101 cycles of Fo (ten cycles of Fd), the control unit 28 once again removes or absorbs one complete cycle of this frequency. At that time, therefore, the phase detector output C drops again to zero.

The result, therefore, as so far described, is that signal C has a sawtooth waveform.

FIG. 2 illustrates the process graphically, though for ease of illustration, N has been assumed to have a value of 2 (instead of 10 in the previous example) and Fo to have a frequency of 225 kHz (instead of 10.1 MHz as in the previous example). Therefore, for every period of Fr, Fo will produce 2.25 pulses and will advance in phase by 0.25 of a cycle.

In FIG. 2, waveform 2A shows Fr, waveform 2B shows Fo assuming it to be exactly 200 kHz, waveform 2C shows Fo as it actually is in this example (225 kHz), and waveform 2D shows Fd.

Because of the frequency difference between Fr and Fd, a phase error will be detected by the phase detector 18 as it compares the phase of each pulse of Fr with each pulse of Fd. FIG. 2E shows the current samples produced by the phase detector; in FIG. 2F, these samples are represented by vertical lines of corresponding height and the result is that these samples increase linearly with the phase error as shown in FIG. 2F.

As shown at point t1, after 4 cycles of the frequency Fr, the frequency Fo has advanced by 1 complete cycle on its nominally correct value (see the inclined dotted lines), that is, there is a 360 degree phase error. During this period, the oscillator output Fo will produce nine cycles (instead of 8 which would be the case if Fo were exactly 200 kHz).

As already indicated, therefore, the control unit 28 is arranged to operate when this situation arises by removing or absorbing one complete cycle of the frequency Fo.

This is shown at A in FIG. 2C. This of course has a corresponding effect on the frequency Fd (see FIG. 2D), so as to bring Fd back into phase equality with Fr and causes a step change in the output of the phase detector 19 (see FIG. 2F). As shown in FIG. 2F, therefore, the signal C drops to zero.

Since frequency Fo is still at 225 kHz, the phase error between Fd and Fr will start again to build up and the value of signal C will increase once more, until, after a further 8 cycles of Fo, the control unit 28 once again removes or absorbs one complete cycle of this frequency and the phase detector output C drops again to zero.

In practice, the removal of one complete cycle of Fo is achieved by a temporary increase by one in the value of N. If divider 13 is in the form of a ring counter, this will have the effect of removing a complete pulse of Fo provided that N is held increased for one cycle of Fr.

If line 22 were re-connected to the control input of the VCO 10, then the sawtooth waveform produced as explained above would be superimposed on a d.c. level. The d.c. level would of course originate from a finite but very small, phase error which would have to be present between Fd and Fr in order to drive the VCO frequency Fo to its nominally correct value (10 MHz or 200 kHz in the two examples taken above), while the sawtooth waveform would result (in the manner already explained) from the additional 0.1 kHz or 25 kHz. However, merely reconnecting line 22 in this way would not be satisfactory because the sawtooth waveform would cause unacceptable modulation of the frequency Fo. On the other hand, however, the sawtooth waveform could not be removed by filtering because the filtering necessary would unacceptably increase the response time of the system.

In a manner to be described in more detail below, therefore, the control unit 28 is arranged to remove the sawtooth waveform in two stages; first, it makes additional adjustments to the value of N, between the step changes already referred to, and thus limits the amplitude of the sawtooth waveform and changes its waveshape, and, secondly, it generates a signal (on line 34) which backs off the residual modulation.

The result, therefore, is that the phase detector 18 controls the VCO frequency Fo accurately at the desired value (10.1 MHz or 225 kHz in these examples) and yet the control loop avoids the need for additional smoothing which would delay its response. Therefore, the output frequency Fo can be changed not only in steps each of which has a minimum value equal to the value of Fr but also in much smaller increments—by making the instantaneous adjustments to the division factor F.

The period (referred to below as T) of the sawtooth waveform will vary of course on the actual difference in frequency between Fo/N and Fr. The average value of Fd will be equal to Fr.

Figure 3:
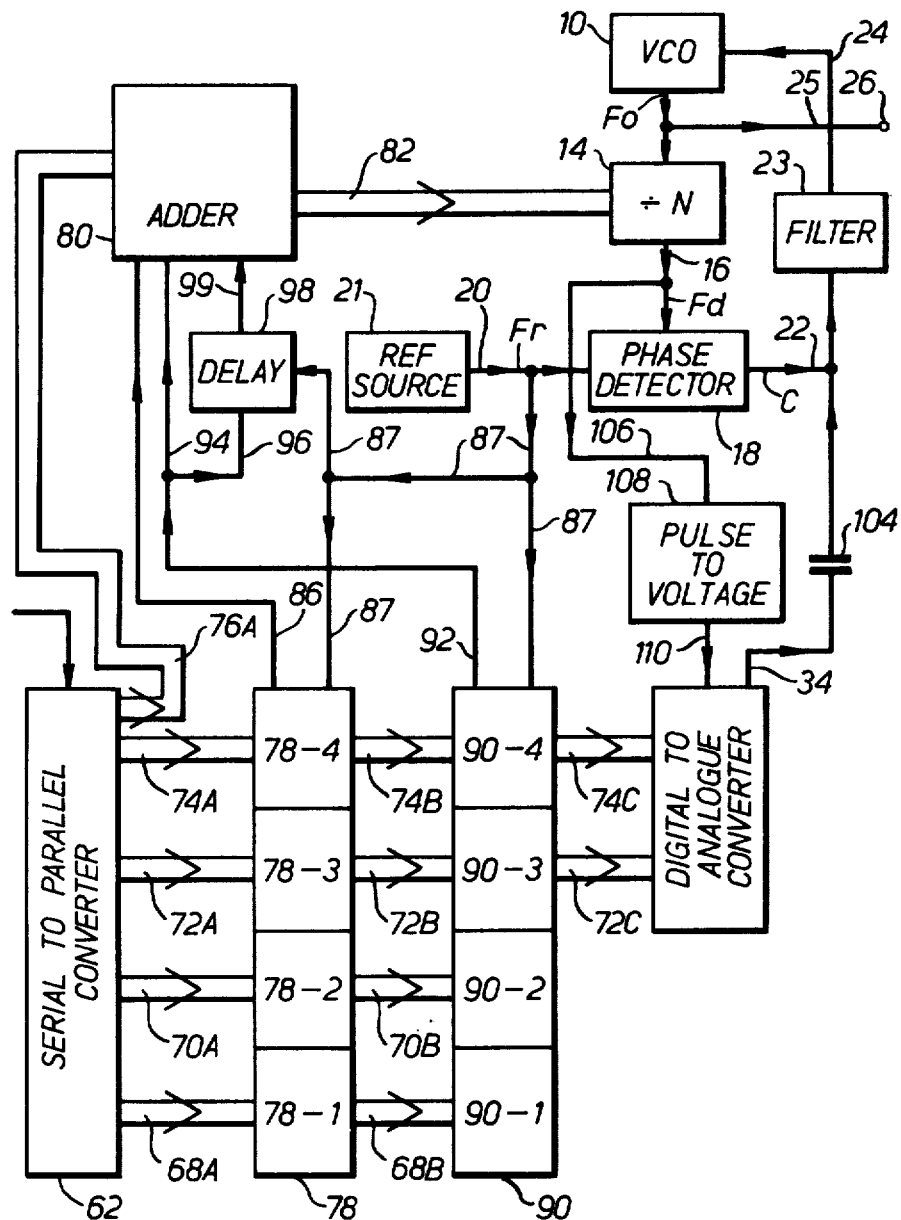
FIG. 3 is a more detailed block diagram of the circuit arrangement.
Figure 4:
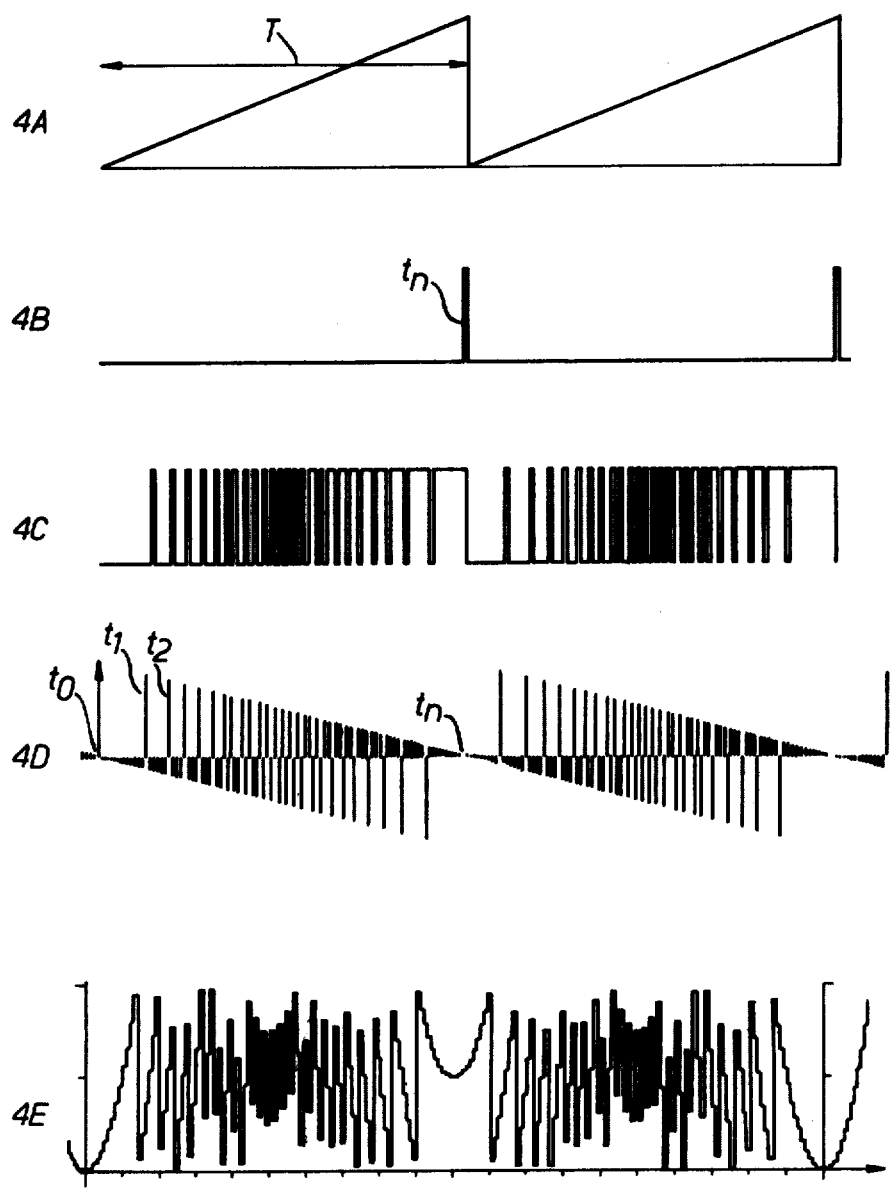
FIG. 4 shows waveforms for explaining the operation of the circuit arrangement of FIG. 3.

FIG. 3 illustrates the circuit diagram of the circuit arrangement in more detail and FIG. 4 shows waveforms explaining its operation.

Items in FIG. 3 corresponding to items in FIG. 1 are correspondingly referenced.

In the example shown in FIG. 3, the range of the VCO 10 is 39.4 to 69.4 MHz, and the division factor N of the divider 14 can be varied between 394 and 694. The reference frequency Fr, produced from the reference frequency source 21, is 100 kHz.

The control unit 28 comprises a serial to parallel data converter 62 which receives input data in serial form, on the line 30, representing the desired value of the output frequency Fo at the output terminal 26. The converter 62 has five output channels 68A, 70A, 72A, 74A and 76A. Channels 68A to 74A respectively carry data representing the number of 10 Hz, the number of 100 Hz, the number of 1 kHz and the number of 10 kHz in the output frequency Fo. These channels feed the data to a first accumulator 78.

The fifth channel 76A carries data representing the number of 100 kHz in the output frequency Fo, and this channel is connected to a data adder 80. The data adder 80 has an output channel 82 which is connected to the divider 14 to set its division factor N.

If the desired output frequency Fo is 100 kHz or an integral multiple of 100 kHz, the channels 68A to 74A will each be at zero, and the adder 80 will respond to the information in channel 76A by setting the division factor N to the appropriate value—which it will hold continuously (assuming that accumulator 78 is empty). However, if the desired output frequency Fo is not an integral multiple of 100 kHz, then at least some of channels 68A to 74A will not be at zero. In a manner to be explained in more detail now, this results in the accumulator 78 making periodic unit changes in the division factor N (equivalent to removing a pulse of Fo).

The accumulator 78 has four stages 78-1, 78-2, 78-3 and 78-4, each having an input, to which a respective one of the input channels 68A, 70A, 72A and 74A is connected, and an output, to which a respective one of four channels 68B, 70B, 72B and 74B is connected. Each stage can hold any one of the ten decimal numbers, and the stages are cascaded so that, when each stage is set to "0", or passes through "0", it produces a carry pulse to the next stage of the series. The carry output of the fourth stage (that is, stage 78-4) is connected to a carry-out line 86.

The accumulator is controlled by clock signals received on a line 87 from the reference signal source 21, and the clock signals therefore occur every 10 uS. The stages are arranged so that, in response to each clock pulse on line 87, each stage adds its previously accumulated total to the input data received on its respective input channel 68A, 70A, 72A or 74A, and produces the new accumulated total on its respective output channel 68B, 70B, 72B or 74B (as well, of course, as passing this output onto the next stage).

The first accumulator 78 therefore has a capacity of 9999. Thus, if the input channels 68A to 74A are calling for 10 Hz, so that channel 68A is set to decimal 1 and the channels 70A, 72A, and 74A are each set to zero, the total in the accumulator 78 will increase by 1 in response to each clock pulse on line 87. Therefore, each ten thousandth clock pulse (occurring every 0.1 seconds) will produce a carry-out signal on line 86. The carry-out signals thus occur ten times per second.

If, for example, the input on channels 68A to 74A is calling for 500 Hz instead (so that channel 70A is set to decimal 5, and channels 68A, 72A and 74A are each set to zero), the total in accumulator 78 will increase by 50 in response to each clock pulse and a carry-out signal on line 86 will thus be produced by each two hundredth clock pulse and will thus occur 500 times per second.

FIG. 4A shows how the number represented by the signals on channels 68B, 70B, 72B and 74B increases progressively to 9999, at a rate dependent on the value of the frequency represented by the signals on channels 68A, 70A, 72A and 74A, and then drops to zero when the carry-out pulse (shown in FIG. 4B) is produced on line 86.

Therefore, the accumulator 78 produces a carry-out signal on line 86 at the number of times per second equal to the frequency programmed into the accumulator on channels 68A to 74A. In other words, each carry-out signal occurs at the end of a period T (see FIG. 2F) as will now be explained in more detail.

Consider a case where the desired value of output frequency Fo is AB.CD MHz. This is equal to ABC.D times 100 kHz. Therefore, channel 76A will carry data representing ABC while channel 74A will be set to a number representing D times 10 kHz, the channels 68A, 70A and 72A being set to zero.

In response to the input data on channel 76A, the adder 80 will set the divison factor N of the divider 14 to ABC—which will cause the phase lock loop to tend to set the output frequency Fo of the VCO 10 to ABC times 100 kHz or AB.C MHz. However, in order that the output frequency Fo is in fact AB.CD MHz instead of AB.C, it is of course necessary for the division factor N to be increased by 1 at the end of every period T. The length of the period T is the time taken for the frequency Fo to advance by exactly 360°. During each cycle (10 uS) of Fr, the frequency Fo will advance by D/10 of a cycle. It will therefore have advanced by one complete cycle after 10/D cycles of Fr, that is, after 100/D uS.

Therefore, T=100/D uS.

As stated above, in this example channel 74A will be set to a number representing D times 10 kHz. Therefore, the accumulator 78 will produce a carry-out signal on line 86 in response to each 10/D clock pulses on line 84. As the clock pulses occur every 10 uS, therefore, the carry-out signal on line 86 will be separated by 100/D uS. Therefore, the carry-out signals on line 86 occur at the period T as required.

The values of the outputs of the channels 68B, 70B, 72B and 74B will represent fractions of the period T. Thus, the values of successive outputs on channel 68B are separated by a number representing $0.0001 \times T$. Similarly, the values of successive outputs on channel 70B are separated by a number representing $0.001 \times T$, the values of successive outputs on channel 72B are separated by a number representing $0.01 \times T$, and the values of successive outputs on channel 74B are separated by a number representing $0.1 \times T$. For any given frequency increment set in by means of the channels 68A to 74A, the actual number represented by the signals on channels 68B to 74B, in response to each clock pulse, would be proportional to the instantaneous phase error between Fr and Fd; however, this is modified (in a manner to be explained) by the fact that the channels 68B, 70B, 72B and 74B are connected to an accumulator 90.

The accumulator 90 has four stages 90-1, 90-2, 90-3 and 90-4. These stages are arranged in similar fashion to the stages 78-1, 78-2, 78-3 and 78-4 of accumulator 78, and the accumulator 90 receives the clock pulses on the line 87 at intervals of 10 uS. The carry output of stage 90-4 is connected to a carry-out line 92.

Accumulator 90 therefore effectively integrates the signal received on the channels 68B, 70B, 72B and 74, and the carry-out signals produced on its line 92 are shown in FIG. 4C. Effectively, line 92 carries a variable mark-space ratio signal whose mark:space ratio increases as accumulator 78 fills up towards its maximum value. Initially, when the total in accumulator 78 is relatively low, each carry-out signal on line 92 will exist for the length of only one clock signal on line 87, but of course accumulator 90 will fill up more rapidly as the total in accumulator 78 increases, therefore producing carry-out signals on line 92 more frequently. In addition, as accumulator 78 fills up, each carry-out signal on line 92 will be held for several clock pulses—because each clock pulse will clock in a number from accumulator 78 which is sufficient to immediately refill accumulator 90 and therefore maintain the carry-out signal on line 92. If the number fed to accumulator 90 from accumulator 78, in response to a clock pulse, is more than sufficient, in combination with the already accumulated total in accumulator 90, to fill the accumulator, then a carry-out signal will be produced on line 92 and the balance remaining after resetting the accumulator to zero will be held in accumulator 90—ready to be added on to the next number fed into the accumulator from accumulator 78 in response to the next clock pulse.

As shown in FIG. 3, line 92 is connected to the adder 80 by means of a line 94. When line 94 is energised by the carry-out signal on line 92, the adder 80 adds 1 to the division factor N. Line 92 is also connected to a further input of the adder 80 by means of a line 96 and a delay unit 98. The delay unit 98 is operated by means of clock signals received on the line 87.

In operation, therefore, each carry-out signal on line 92 causes the adder to increase the division factor N of the divider 14 by 1 to (N+1). At the end of the clock pulse which produced that carry-out signal, the division factor will tend to revert to N. However, the next clock pulse will cause the delay unit 98 to produce an output on line 99 which will cause the unit 80 to subtract 1 from the division factor, thus causing it to switch to (N−1). At the end of that clock pulse, the division factor will revert to N. In effect, the delay unit 98 and the unit 80 act to differentiate the carry-out signals which represent the integral of phase.

If the previous contents of the accumulator 90 (before the clock pulse producing the carry-out signal), and the input on channels 90-1, 90-2, 90-3 and 90-4, are both sufficiently great, the clock pulse will not only produce a carry-out signal but will leave such remainder in the accumulator 90 that the next clock pulse will also cause the production of a carry-out signal. However, the effect of the delay unit 98 is such that the unit 80 receives inputs on both lines 94 and 99 during this second clock pulse and therefore the division factor is held at N. It will then be switched to (N−1) by the delay unit 98 for the duration of the first clock pulse after the carry-out signal on line 92 has ended.

The effect of this is illustrated in FIG. 4D which shows the output of the phase detector 18, the output being shown as a series of vertical lines representing the signs and magnitudes of the current samples produced by the detector 18 in comparing the phase of each pulse of Fd with the corresponding pulse of Fr.

At time $t_o$, Fd and Fr are assumed to be in phase. Fo is assumed to be at the value set by the input data and is therefore not at an integral multiple of Fr (because of the frequency increment set by the signals on channels 68A, 70A, 72A and 74A). Therefore, a progressive phase error between Fd and Fr will be detected by the phase detector 18 as shown over the period between $t_o$ and $t_1$ (FIG. 4D). At $t_1$, however, the first carry-out signal occurs on line 92 (see FIG. 4C). As explained above, this causes N to increase to (N+1), then to decrease to (N−1) and finally to revert to N. This takes place within three clock pulses and in effect delays Fd with respect to Fr so as to change Fd from leading with respect to Fr to lagging with respect to Fr. The amount of phase lag will be substantially the same as to the aggregate of the phase leads detected by the phase detector 18 up to $t_1$. Therefore, the phase detector 18 will respond by producing an output (at $t_1$, see FIG. 4D) of the opposite sign to the preceding outputs and of magnitude approximately equal to their sum. The phase detector output, C, will therefore fall substantially to zero.

After $t_1$, when N has reverted to its previous value, the phase detector output C commences to build up again in the same direction as between instants $t_o$ and $t_1$, until at time $t_2$ another carry-out signal occurs on line 92 (see FIG. 4C) and once more causes an increase (of one) in the value N followed by a decrease to (N−1) and reversion to N. Again, therefore, the phase detector output, C, changes sign and increases in magnitude to back off the previously accumulated current samples, and C reverts to approximately zero again.

This process continues as shown by comparing FIGS. 4C and 4D. As is shown in FIGS. 4C and 4D, as the contents of accumulator 90 increase during the period T, each carry-out signal on line 92 may exist for more than one clock pulse and therefore, after being initially switched to (N+1), the division factor will be held at N for this length of time until temporary switching to (N−1) after the carry-out signal has ended. This means that Fd is held in phase-lagging relationship to Fr for this time, during which the phase detector output, C, builds up in the opposite direction (positive in FIG. 4D) until, after the division factor has gone to (N−1) and then reverted to N, Fd and Fr are brought back to their original phase relationship and signal C now changes sign and builds up again in the negative sense.

Eventually, at time $t_n$, the carry-out signal occurs on line 86 (see FIGS. 3 and 4B) when Fd and Fr are in phase and the phase detector output C is zero.

The process then repeats.

The result, therefore, is that the signal C does not have a sawtooth waveform but a much smaller or residual waveform which varies around zero throughout the period T.

Figure 5:
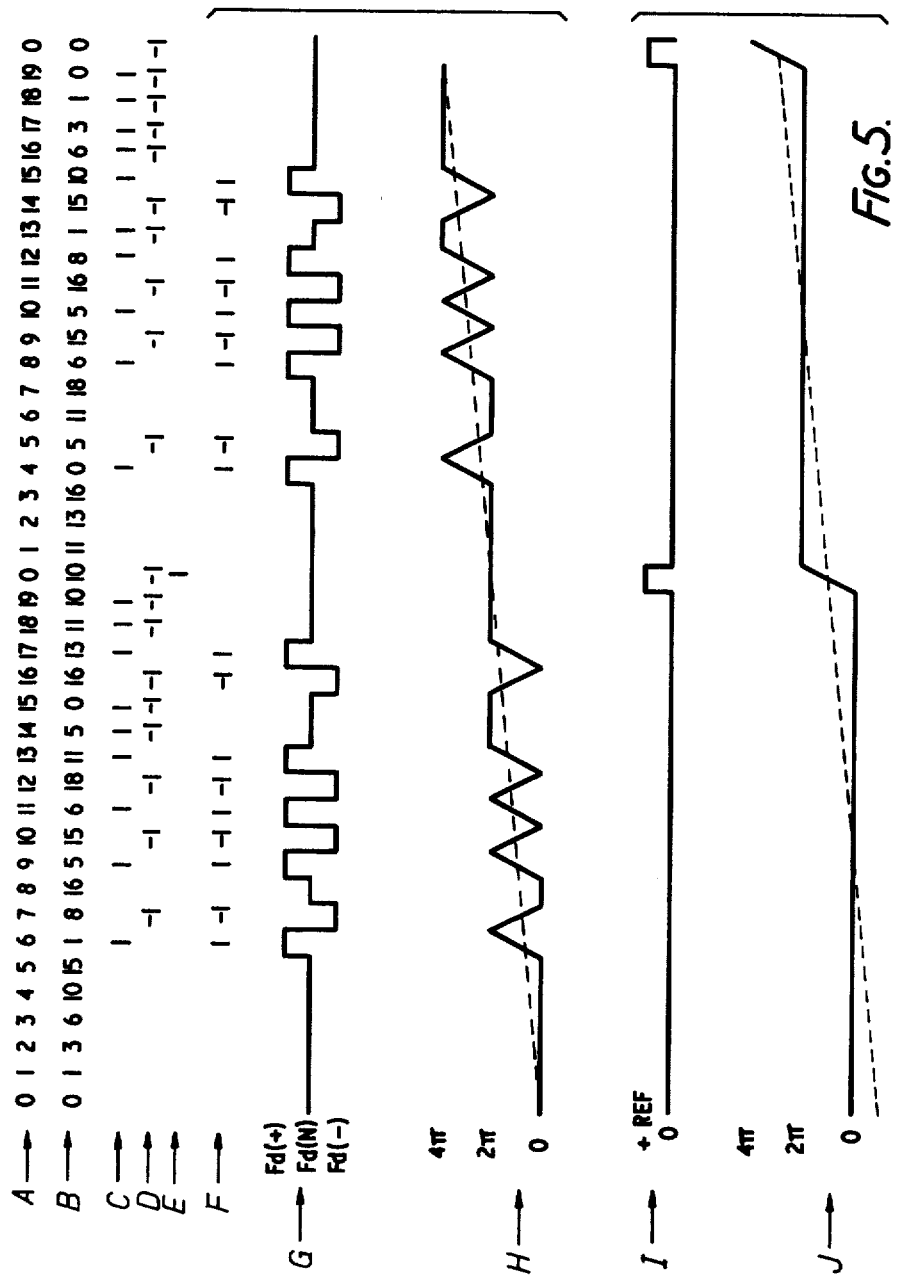
FIG. 5 shows more waveforms for explaining in greater detail part of the circuit arrangement.

FIG. 5 illustrates in a different way the process just described.

In FIG. 5, purely for ease of illustration, it is assumed that accumulator 78 has a capacity of 20 and that the input number represented by the signals on channels 68A to 74A is 1. Therefore, at A in FIG. 5, is shown the contents of accumulator 78—increasing with successive clock pulses. At B, the increasing contents of accumulator 90 are shown.

As each accumulator reaches 20, it produces a carry-out signal, on line 86 or 92. At C in FIG. 5, the carry-out signals produced on line 92 from accumulator 90 are shown (represented by "1") while the signals produced at the output line 99 of the delay unit 98 are shown at D in FIG. 5 (and represented by "−1").

The carry-out signals produced on line 86 by accumulator 78 are shown at E in FIG. 5.

As explained above, each signal on line 94 causes the adder 80 to increase the division factor N to (N+1), while each signal on line 99 causes the adder 80 to reduce the division factor N to (N−1), but, if signals are simultaneously present on lines 94 and 99, the adder 80 maintains the division factor at N. Therefore, at F in FIG. 5, there is shown the total effect of the carry-out signals on line 92 on the division factor.

FIG. 5G illustrates graphically the resultant changes in the value of Fd from the value that it has when the division factor is N, this value being indicated as Fd(N), the value when the division factor is (N+1) being indicated as FD(+) and the value when the division factor is (N−1) being indicated as Fd(−).

The corresponding change in the phase of Fd with reference to Fr is shown in FIG. 5H.

By way of comparison, FIGS. 5I and 5J correspond to FIGS. 5G and 5H but show the frequency and phase which would arise if accumulator 90 were omitted. In FIGS. 5H and 5J, the dotted line represents the ideal phase change.

As is shown by comparing FIG. 5H with FIG. 5J, the effect of accumulator 90 is to bring Fd and Fr partially into phase during each period T so that the whole phase change is not delayed until the end of the period.

As explained with reference to FIG. 4D, the residual phase detector output is a signal varying around a mean level (nominally zero) and is shown in FIG. 5H by the variation of the said line about the dotted line.

In order to remove this residual waveform, the stages 90-3 and 90-4 of the accumulator 90 have respective output channels 72C and 74C. These channels carry the instantaneous totals in the stages 90-3 and 90-4 and feed these totals to a digital to analogue converter 100. The output line of the converter 100 is the line 34 which is connected through a small capacitor 104 to sum its output with the output of the phase detector 18 on the line 22.

The decimal number output by the channels 72A and 74C will increase stepwise in response to the occurrence of each clock pulse on line 87 (until, of course, the accumulator becomes full and starts counting again). The size of each step increase in this number will depend on the size of the phase outputs on the channels 68B, 70B, 72B and 74B of accumulator 78, which will in turn depend on the frequency called for by the data on channels 68A, 70A, 72A and 74A. As previously explained, the change in the number represented by the phase outputs on the lines 68B, 70B, 72B and 74B, in response to each clock pulse, is proportional to the phase error that exists during the corresponding cycle of the reference frequency Fr between that frequency and Fd. Therefore, the number represented by the output on channels 72C and 74C changes in proportion to the accumulated phase error between Fd and Fr and is shown in FIG. 4E. This output therefore matches the resultant waveform of signal C.

Therefore, after conversion into analogue form in the converter 100, and appropriate scaling, the waveform of FIG. 4E is backed off, via the small capacitor 104, against the signal C on line 22. The capacitor 204 is provided to differentiate the analogue output, which, being produced by the accumulator 90, represents the integral of phase.

The amount of scaling necessary in order that the analogue output from converter 100 exactly matches the variations in signal C will vary with the frequency Fd. Therefore, this frequency is fed by means of a line 106 to a pulse frequency to voltage converter 108, and the resultant control signal on a line 110 appropriately adjusts the scaling of the output of the converter 100.

In this way, therefore, the output frequency Fo can be incrementally adjusted in steps which are much less in size (down to 10 Hz in this example) than the value of the reference frequency Fr. This is achieved, as explained, by making periodic unit adjustments in the division factor N, but the resultant sawtooth waveform which the phase detector would otherwise produce is backed off substantially to zero without using filtering which would seriously increase the response time of the system. Furthermore, this backing off of the sawtooth waveform of the phase detector is mainly achieved by semi-continuous adjustments in the phase difference between Fd and Fr so as to prevent the build-up of too big a phase difference. It is only necessary, therefore, for the residual varying waveform of the phase detector to be backed off by means of the analogue signal, and the accuracy requirements of the analogue to digital converter are within practical limits.

In a modification, the control unit 28 can be arranged to provide periodic adjustments in the value of Fr. This enables the period T to be reduced in length.

What is claimed is:

1. An electrical circuit arrangement for producing a variable frequency output, comprising:
    a variable frequency source producing an output frequency;
    an integrally adjustable frequency divider connected to receive the output frequency to produce a divided frequency;
    a reference frequency source;
    a phase comparator connected to compare the phase of the divided frequency with the phase of the reference frequency whereby to produce an output whose sign and level depend on the phase difference;
    means feeding the output of the phase comparator to the variable frequency source to control its output frequency in a sense tending to reduce the said phase difference to zero;
    means for periodically varying the division factor of the divider whereby its average value is such that the output frequency has a desired value;
    means operative within each period of variation of the division factor to cause repeated and temporary shifts in the phase of the divided frequency with respect to the reference frequency whereby to offset the effect on its output signal which the phase differences detected by the phase detector up to that shift would otherwise have; and
    means for offsetting the residual variations of the output signal of the phase detector between the said shifts.

2. An arrangement according to claim 1, in which each said shift in phase is produced by a temporary change in one sense of the value of the division factor of the divider followed by a temporary change of equal and opposite amount.

3. An electrical circuit arrangement for producing a variable frequency output, comprising:
    a variable frequency source producing an output frequency;
    an integrally adjustable frequency divider connected to receive the output frequency to produce a divided frequency;
    a reference frequency source;
    a phase comparator connected to compare the phase of each pulse of the divided frequency with the phase of each pulse of the reference frequency whereby to produce an output whose sign and level depend on the phase difference;
    control means for periodically producing a step change in the relative phase of the divided frequency and the reference frequency, the period and amount of the step change being such as to tend to bring the divided frequency and the reference frequency temporarily into phase, whereby the phase comparator output is brought substantially to a datum level at the end of each such period but varies within each such period;
    offsetting means for substantially offsetting the variations of the phase comparator output within each said period; and
    means for feeding the resultant phase comparator output to the variable frequency source so as to control the output frequency at such value that the average value of the divided frequency is the same as the reference frequency, the value of the output frequency being dependent on the value of the reference frequency, the value of the division factor, and the length of the said period.

4. An arrangement according to claim 3, in which the control means for producing the step change in the relative phase of the divided frequency and the reference frequency comprises:

means responsive to a desired value for the output frequency for deriving therefrom that part thereof which is not an integral multiple of the reference frequency, means responsive to the derived part to produce a succession of first control signals at the period of the said derived part, and means responsive to each first control signal to produce the said step change in relative phase.

5. An arrangement according to claim 4, in which the offsetting means comprises:

interpolating means operative at each of a plurality of instants distributed within each said period to produce a temporary relative phase shift between the divided frequency and the reference frequency of such value as substantially to back off the accumulated phase difference between the divided frequency and the reference frequency as determined by the phase detector up to that instant, and analogue means operative to produce an analogue output opposite and substantially equal to the residual variation in the phase detector output.

6. An arrangement according to claim 5, in which the interpolating means comprises means operative at the reference frequency to produce a succession of second control signals whose values progressively change, in synchronism with the reference frequency, by an amount dependent on the value of the said part, and means operative to integrate the values of the second control signals and to produce a third control signal each time the integrated value reaches a predetermined level, each third control signal being connected to cause a said instantaneous phase shift.

7. An arrangement according to claim 3 or 4, in which the control means for producing the step change in the relative phase of the divided frequency and the reference frequency comprises means for temporarily altering the division factor of the frequency dividing means.

8. An electrical circuit arrangement, comprising:

a variable frequency oscillator (VCO) producing an output frequency;

a variable frequency divider connected to receive the output frequency and to produce therefrom a divided frequency;

a reference frequency source;

a phase detector having two inputs respectively connected to receive the divided frequency and the reference frequency and which compares the instantaneous phase difference between each pulse of the divided frequency and the corresponding pulse of the reference frequency whereby to produce a control output of corresponding magnitude and sign;

means responsive to a desired value of the output frequency to derive therefrom a first part thereof which is an integral multiple of the reference frequency and to set the division factor to a number equal to that multiple, and to derive a second or remaining part;

means operative at the period of the remaining part to make a unit change in a predetermined direction in the value of the division factor whereby, when the output frequency of the VCO has the desired value, to bring the divided frequency and the reference frequency into phase equality;

means responsive to the integral of the phase differences between the divided frequency and the reference frequency to produce a change in the division factor at each of successive instants, within each said period, when the integrated value reaches a predetermined level, whereby to produce an instantaneous phase shift between the divided frequency and the reference frequency of such direction and magnitude as to reduce the integrated value substantially to zero, whereby the phase detector produces an output during each said period which varies residually between the said instants;

analogue means responsive to the said integrated values between successive instants to produce an analogue output;

means feeding the analogue output so as substantially to back off the residual variations of the phase detector output whereby to produce a resultant phase detector output substantially without the said variations; and means feeding the resultant phase detector output to control the output frequency of the VCO at the desired value.

* * * * *